United States Patent [19]

Ross, deceased et al.

[11] Patent Number: 4,524,237

[45] Date of Patent: Jun. 18, 1985

[54] INCREASED VOLTAGE PHOTOVOLTAIC CELL

[75] Inventors: Bernd Ross, deceased, late of San Diego, Calif.; Donald B. Bickler, Temple City, Calif.; Brian D. Gallagher, Costa Mesa, Calif.

[73] Assignee: The United States of America as represented by the Administrator of the National Aeronautics and Space Administration, Washington, D.C.

[21] Appl. No.: 578,390

[22] Filed: Feb. 8, 1984

[51] Int. Cl.³ ............................................. H01L 31/06
[52] U.S. Cl. ................................... 136/261; 136/255; 136/256; 357/30
[58] Field of Search ................. 136/255, 256, 261; 357/30

[56] References Cited

U.S. PATENT DOCUMENTS

| | | | |
|---|---|---|---|
| 3,078,328 | 2/1963 | Jones | 136/256 |
| 3,397,448 | 8/1968 | Tucker | 29/577 |
| 3,400,309 | 9/1968 | Doo | 357/49 |
| 3,812,519 | 5/1974 | Nakamura et al. | 357/38 |
| 3,858,238 | 12/1974 | Nakamura et al. | 357/63 |
| 4,028,149 | 6/1977 | Deines et al. | 148/175 |
| 4,109,271 | 8/1978 | Pankove | 357/30 |
| 4,123,571 | 10/1978 | Balog et al. | 427/249 |
| 4,161,743 | 7/1979 | Yonezawa et al. | 357/54 |
| 4,238,436 | 12/1980 | Hill et al. | 264/81 |
| 4,239,554 | 12/1980 | Yamazaki | 136/255 |
| 4,239,788 | 12/1980 | Beck | 427/43.1 |

OTHER PUBLICATIONS

T. J. Moravec et al., *J. Vac. Sci. Technol.*, vol. 20, pp. 338-340 (1982).

J. A. Minnucci et al., *Conf. Record, 14th IEEE Photovoltaic Specialists Conf.* (1980), pp. 93-96.

*Primary Examiner*—Aaron Weisstuch
*Attorney, Agent, or Firm*—Paul F. McCaul; John R. Manning; Thomas H. Jones

[57] ABSTRACT

A photovoltaic cell, such as a solar cell, is provided which has a higher output voltage than prior cells. The improved cell includes a substrate of doped silicon, a first layer of silicon disposed on the substrate and having opposite doping, and a second layer of silicon carbide disposed on the first layer. The silicon carbide preferably has the same type of doping as the first layer.

2 Claims, 3 Drawing Figures

INCREASED VOLTAGE PHOTOVOLTAIC CELL

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

Photovoltaic cells are often constructed of silicon or germanium, with silicon being preferred because it produces a higher output voltage. However, even the output voltage of a silicon cell is low, such as about 0.5 volt. When used as solar cells to produce large amounts of electricity, the low power resulting from low voltage at a given current, and the fact that the power is produced at low voltage, reduces the utility of the solar cells. Photovoltaic cells, which are often referred to as solar cells, which could produce higher voltages to convert solar energy to electricity at greater efficiency and to deliver the electricity at higher voltage, would be highly desireable.

SUMMARY OF THE INVENTION

In accordance with one embodiment of the present invention, a photovoltaic cell is provided, which produces higher voltages than cells of the prior art. The present cell includes a silicon substrate and a first layer of silicon lying on the substrate, with the substrate and first layer being oppositely doped so that one is p-doped and the other is n-doped. A second layer which includes carbon, such as crystalline silicon carbide, lies on the first layer and preferably has the same doping as the first layer. The second layer increases the width of the depletion zone formed between the substrate and first layer so that the voltage across the depletion zone can increase to a higher level than heretofore to increase the voltage and efficiency of the photovoltaic cell.

The novel features of the invention are set forth with particularity in the appended claims. The invention will be best understood from the following description when read in conjunction with the accompanying drawings.

DESCRIPTION OF THE INVENTION

Figure 1:
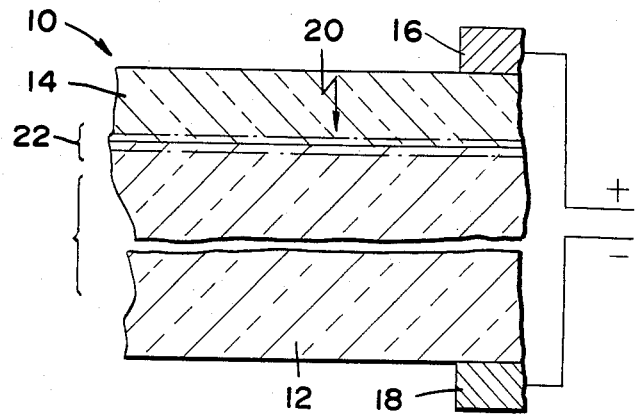
FIG. 1 is an enlarged partial cross-sectional view of a photovoltaic cell of the prior art.

FIG. 1 illustrates a prior art photovoltaic or solar cell 10 which includes a silicon substrate 12 and a layer 14 of silicon on a face of the substrate, with the substrate and layer being oppositely doped, one being p-doped and the other being n-doped. A pair of electrodes 16, 18 are attached to opposite faces of the cell. When a photon of light, indicated at 20 enters the layer 14 and strikes a silicon atom, the photon knocks loose an electron to create an electron-hole pair. In one example, the layer 14 is p-doped and the substrate is n-doped (although the reverse could be used). The electrons knocked loose by the photon 20 migrate to a depletion zone 22 which is located at the interface of the substrate and layer. Under open circuit conditions, the electrons build up at the bottom of the depletion layer (closest to the substrate 12) and the voltage across the cell rises. The open circuit voltage of the cell cannot increase beyond a certain voltage, such as 0.5 volt, because the depletion zone is then saturated and electrons migrate back up across the depletion zone as fast as they move down across it.

Figure 2:
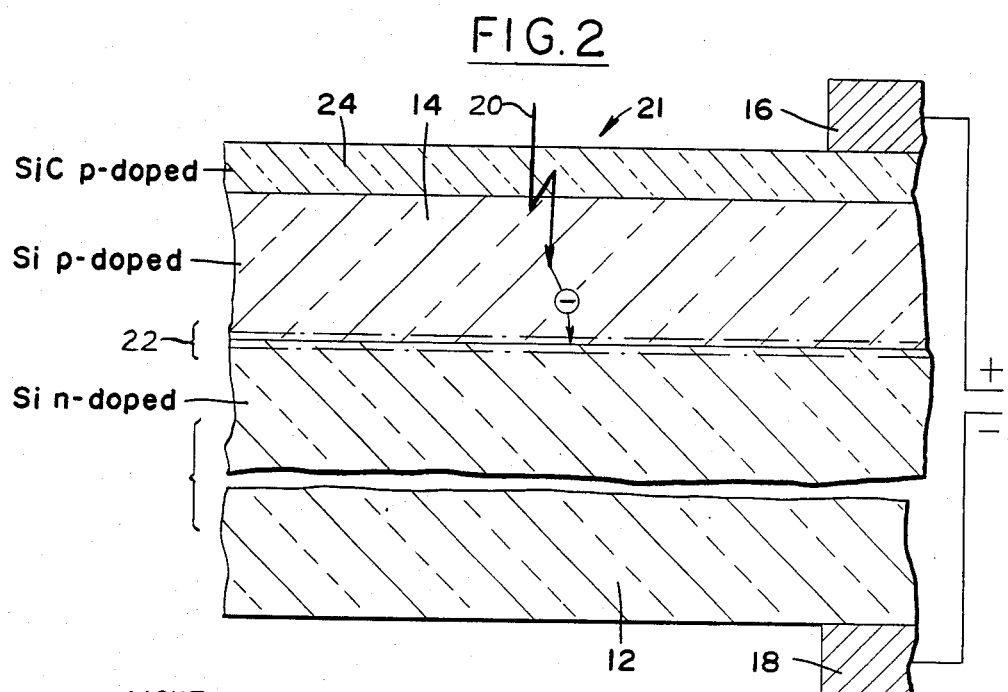
FIG. 2 is an enlarged, but not necessarily to scale, partial cross-sectional view of a photovoltaic cell constructed in accordance with the present invention.

In accordance with the present invention, a second layer 24 (FIG. 2) is provided on a surface of the first layer 14 which is opposite the substrate 12, with the uppermost electrode 16 lying on top of the second layer 24. The second layer 24 is formed of doped silicon carbide. The second layer 24 is preferably doped with the same doping type as the first layer, and of cubic crystalline form to closely match the crystalline silicon. Thus, if the first layer 14 is p-doped, the second layer 24 is also p-doped. With a second layer 24 of doped silicon carbide, the silicon carbide layer 24 broadens the width of the depletion zone 22. With a wider depletion zone, it requires a greater voltage for electrons trapped in the depletion zone 22 to break through and return to the first layer 14. As a result, the open circuit voltage that can build up across the cell, as measured by the voltage between the electrode 16, 18, builds up to a much higher level such as 1.2 volts, than the voltage (such as 0.5 volt) that can build up in a cell without the silicon carbide layer. Although an undoped silicon carbide layer can increase the voltage output of a silicon cell, a doped silicon carbide layer can increase the voltage more.

Figure 3:
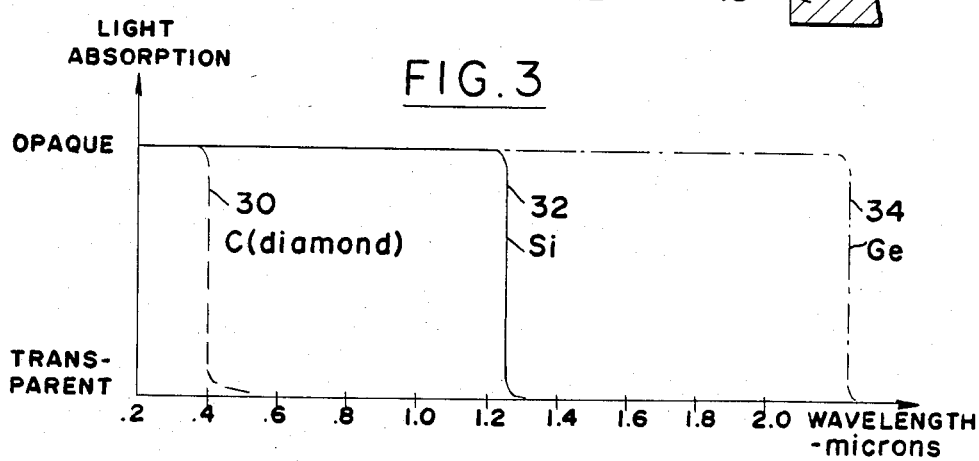
FIG. 3 is a simplified and idealized graph showing a relationship between light absorbtion and the wavelength of light for materials that could be useful in photovoltaic cells.

The doped silicon carbide layer 24 produces a crystalline/chemical potential, that acts like a positive static charge that repels electrons to push them down so as to increase the width of the depletion zone 22. Appreciable current is not created by light (photons) absorbed by atoms in the silicon carbide layer 24, but instead the silicon carbide layer passes most of the incident light so that the photons of the light can strike the first layer 14 to create current there. Silicon carbide is useful because it transmits a large portion of sunlight that would be absorbed, but not utilized to create current, by other materials. FIG. 3 shows in idealized form, the light absorbtion characteristics of various materials that could be used in solar cells. Pure carbon crystal (diamond), represented by graph 30, could serve as a good second layer, because it absorbs only ultra-violet light and passes a high proportion of light above about 0.4 micron wavelength so that most of the power of sunlight would pass through a carbon crystal layer. However, it is not known at this time how to form a crystalline carbon layer.

Silicon carbide has transmission characteristics about half way between those of carbon crystals shown at 30 which transmits almost all useful sunlight, and silicon shown at 32, which blocks most of the useful sunlight. For comparison, it can be seen that germanium, shown by the graph 34, blocks even a greater spectrum than silicon.

In one example of a solar cell 21 of the present invention, a doped silicon first layer 14 of a thickness such as 0.2 micron is grown on a substrate 12 of oppositely doped silicon which may have a thickness such as 1 milimeter. A doped (over $10^{12}$ doping atoms per cubic centimeter) silicon carbide layer 24 is deposited on the first layer 14 by any of several known deposition techniques such as by glow discharge of a silicon element in a carbon-containing gas, ion implantation of carbon in silicon, or molecular beam epitaxy. The thickness of the silicon carbide second layer 24 should be very thin, so there are minimum stresses between the crystal structure of the silicon carbide and the crystalline structure of the silicon first layer 14. However, the silicon carbide layer must be just thick enough to avoid defects such as pin holes and thin spots. The silicon carbide layer generally can be made less than one-half the thickness of the first layer 14. A thickness of the silicon carbide layer 24 of about 0.1 micron is desireable to minimize stress on the first layer 14 while avoiding defects in the silicon carbide layer, and while also serving as an antireflective coating. A thickness of about 0.1 micron is about one-quarter wavelength of light having a wavelength of about 0.5 micron which is one of the most important wavelengths for the conversion of sunlight to electricity for silicon solar cells.

Thus, the invention provides a photovoltaic cell which produces a higher voltage output than prior art cells. The voltage output of a primarily silicon cell that comprises a substrate of doped silicon and a first layer of oppositely doped silicon, is increased by the addition of a second layer of a carbon-containing crystalline material. The carbon-containing second layer preferably has the same type of doping as the first layer and lies on it. A suitable second layer material is silicon carbide, and has a thickness which is less than the thickness of the silicon layer lying under it. Such second layer, increases the width of the depletion zone so that a higher voltage can build up in the cell.

Although particular embodiments of the invention have been described and illustrated herein, it is recognized that modifications and variations may readily occur to those skilled in the art and consequently, it is intended that the claims be interpreted to cover such modifications and equivalents.

What is claimed is:

1. A photovoltaic cell comprising:
   a substrate of crystalline silicon;
   a first layer of crystalline silicon disposed on said substrate; and
   a second layer disposed on said first layer;
   said substrate and said first layer having opposite types of doping, one being p-doped and the other being n-doped;
   said second layer comprising crystalline silicon carbide.

2. The apparatus described in claim 1 wherein:
   said second layer has doping of the same type as said first layer.

* * * * *